(12) United States Patent
Tolle et al.

(10) Patent No.: US 12,195,876 B2
(45) Date of Patent: *Jan. 14, 2025

(54) GAS-PHASE REACTOR SYSTEM-WITH A REACTION CHAMBER, A SOLID PRECURSOR SOURCE VESSEL, A GAS DISTRIBUTION SYSTEM, AND A FLANGE ASSEMBLY

(71) Applicant: ASM IP Holding B.V., Almere (NL)

(72) Inventors: John Tolle, Gilbert, AZ (US); Joseph P. Margetis, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/372,803

(22) Filed: Sep. 26, 2023

(65) Prior Publication Data

US 2024/0011189 A1    Jan. 11, 2024

Related U.S. Application Data

(63) Continuation of application No. 16/849,793, filed on Apr. 15, 2020, now Pat. No. 11,814,747.

(60) Provisional application No. 62/838,175, filed on Apr. 24, 2019.

(51) Int. Cl.
| | |
|---|---|
| C30B 31/16 | (2006.01) |
| C30B 25/08 | (2006.01) |
| C30B 25/14 | (2006.01) |
| C30B 25/16 | (2006.01) |
| C30B 25/18 | (2006.01) |
| H01L 21/67 | (2006.01) |

(52) U.S. Cl.
CPC .............. *C30B 25/14* (2013.01); *C30B 25/08* (2013.01); *C30B 25/16* (2013.01); *C30B 25/18* (2013.01); *H01L 21/67011* (2013.01)

(58) Field of Classification Search
CPC ......... C30B 25/00; C30B 25/02; C30B 25/08; C30B 25/10; C30B 25/14; C30B 25/16; C30B 25/18; C30B 31/00; C30B 31/02; C30B 31/06; C30B 31/10; C30B 31/16; C30B 31/165; C30B 31/18; C30B 35/00; C30B 35/002; H01L 21/67011
USPC ....... 117/84, 89, 93, 99, 102, 105, 200–202, 117/204, 928–930, 936; 118/715, 722, 118/724, 726
See application file for complete search history.

(56) References Cited

U.S. PATENT DOCUMENTS

| | | | |
|---|---|---|---|
| 4,936,877 A | 6/1990 | Hultquist | |
| 6,142,773 A | 11/2000 | Shimazu | |
| 8,154,210 B2 | 4/2012 | Horsky et al. | |
| 10,167,557 B2 | 1/2019 | Hawkins et al. | |
| 11,814,747 B2 * | 11/2023 | Tolle | ..................... C23C 16/448 |
| 2002/0011210 A1 * | 1/2002 | Satoh | .................. C23C 16/4405 |
| | | | 118/723 R |

(Continued)

FOREIGN PATENT DOCUMENTS

| | | |
|---|---|---|
| JP | H02215122 A | 8/1990 |
| JP | 6204231 B2 | 9/2017 |

*Primary Examiner* — Kenneth A Bratland, Jr.
(74) *Attorney, Agent, or Firm* — Snell & Wilmer LLP.

(57) ABSTRACT

Gas-phase reactor systems and methods suitable for use with precursors that are solid phase at room temperature and pressure are disclosed. The systems and methods as described herein can be used to, for example, form amorphous, polycrystalline, or epitaxial layers (e.g., one or more doped semiconductor layers) on a surface of a substrate.

20 Claims, 5 Drawing Sheets

(56) References Cited

U.S. PATENT DOCUMENTS

| | | |
|---|---|---|
| 2002/0117262 A1 | 8/2002 | Pang |
| 2005/0016452 A1* | 1/2005 | Ryu .................. C23C 16/455 |
| | | 118/715 |
| 2006/0105107 A1 | 5/2006 | Lindeboom |
| 2008/0216743 A1 | 9/2008 | Chen |
| 2009/0269879 A1 | 10/2009 | Adekore |
| 2012/0240858 A1 | 9/2012 | Taniyama |
| 2015/0267299 A1* | 9/2015 | Hawkins ........... C23C 16/45523 |
| | | 427/255.28 |
| 2018/0094350 A1* | 4/2018 | Verghese ............ C23C 16/4481 |
| 2020/0002811 A1* | 1/2020 | Sreeram .............. C23C 16/4409 |

* cited by examiner

GAS-PHASE REACTOR SYSTEM-WITH A REACTION CHAMBER, A SOLID PRECURSOR SOURCE VESSEL, A GAS DISTRIBUTION SYSTEM, AND A FLANGE ASSEMBLY

CROSS-REFERENCE TO RELATED APPLICATIONS

This application is a continuation of, and claims priority to and the benefit of, U.S. patent application Ser. No. 16/849,793, filed Apr. 15, 2020 and entitled "GAS-PHASE REACTOR SYSTEM-WITH A REACTION CHAMBER, A SOLID PRECURSOR SOURCE VESSEL, A GAS DISTRIBUTION SYSTEM, AND A FLANGE ASSEMBLY," which is a Non-Provisional of, and claims priority to and the benefit of, U.S. Provisional Patent Application No. 62/838,175, filed Apr. 24, 2019 and entitled "GAS-PHASE REACTOR SYSTEM AND METHOD OF USING SAME," which are hereby incorporated by reference herein.

FIELD OF INVENTION

The present disclosure generally relates to gas-phase reactor systems and methods of using same.

BACKGROUND OF THE DISCLOSURE

Gas-phase reactors, such as chemical vapor deposition (CVD), plasma-enhanced CVD (PECVD), atomic layer deposition (ALD), and the like can be used for a variety of applications, including depositing and etching materials on a substrate surface. For example, gas-phase reactors can be used to deposit and/or etch layers on a substrate to form semiconductor devices, flat panel display devices, photovoltaic devices, microelectromechanical systems (MEMS), and the like.

A typical gas-phase reactor system includes one or more reactors, each reactor including one or more reaction chambers; one or more precursor and/or reactant gas sources fluidly coupled to the reaction chamber(s); one or more carrier and/or purge gas sources fluidly coupled to the reaction chamber(s); one or more gas distribution systems to deliver gasses (e.g., the precursor/reactant gas(es) and/or carrier or purge gas(es)) to a surface of a substrate within a reaction chamber; and at least one exhaust source fluidly coupled to the reaction chamber(s).

Use of precursors, which are solids at room temperature and pressure (solid source chemical), in gas-phase reactor systems may be desirable, because such precursors may be relatively easy to transport, may be relatively safe to transport, may provide desirable film properties, and/or may be relatively inexpensive to use. However, use of precursors that are solid at room temperature and pressure can be problematic, because it may be difficult to control a flowrate of the precursor to the reaction chamber and/or because undesired condensation of the precursor can occur. Accordingly, improved gas-phase reactors, systems including the reactors, and methods of using the systems and reactors are desired.

SUMMARY OF THE DISCLOSURE

Various embodiments of the present disclosure relate to reactor systems, to methods of providing gas-phase reactants to a surface of a substrate, and to methods of forming (e.g., amorphous, polycrystalline, or epitaxial) films. The systems and methods can be used in the manufacturing of electronic devices. While the ways in which various embodiments of the present disclosure address drawbacks of prior methods and systems are discussed in more detail below, in general, various embodiments of the disclosure provide improved systems and methods suitable for use with precursors that are solid phase at room temperature and pressure (solid source chemical(s)). For example, the systems and methods can be used in the formation of films deposited during formation of electronic devices.

In accordance with at least one embodiment of the disclosure, a reactor system includes a reaction chamber, a solid precursor source vessel fluidly coupled to the reaction chamber, a gas distribution system fluidly coupled to the solid precursor source vessel, and a flange assembly that receives gas(es) from the gas distribution system. The reactor system can include a heated line between the solid precursor source vessel and the reaction chamber. The gas distribution system can include a first gas line coupled to a plurality of first gas outlets. The first gas outlets (e.g., each of the first gas outlets) can be fluidly coupled to an outlet port of a plurality of outlet ports within the flange assembly. In accordance with examples of the disclosure, the flange assembly can include at least one heater. The flange assembly can additionally or alternatively include at least one cooling channel. The flange assembly can be coupled to a reaction chamber using a sealing member that can be located, at least partially, within a recess formed within a first surface of the flange assembly. The sealing member can be formed of, for example, silicone, perfluoroelastomer, or a fluoropolymer (e.g., FKM). Exemplary reactor systems described herein can include an epitaxial reaction chamber, which can be used to deposit epitaxial films, such as silicon (Si), germanium (Ge), silicon germanium (SiGe), silicon carbide (SiC), and/or silicon germanium carbide (SiGeC). The epitaxial films can be doped with, for example, one or more dopants selected from the group consisting of Al, Ga, In, and Sb. A doping level for the one or more dopants can range from about $1E17$ at/cm$^3$ to $1E22$ at/cm$^3$ or about $2E20$ at/cm$^3$ to $7E21$ at/cm$^3$, individually or cumulatively.

In accordance with additional embodiments of the disclosure, a method of providing gas-phase reactants to a surface of a substrate includes providing a gas-phase reactor system, such as a reactor system described herein, providing a substrate within a reaction chamber of the reactor system, and exposing the substrate to a first gas from a solid precursor source vessel and a second gas from a second gas source. An exemplary method can further include heating the flange assembly, the solid precursor source vessel, the gas distribution system, and/or one or more lines—e.g., using one or more heaters. Additionally or alternatively, an exemplary method can include providing cooling fluid to the flange assembly. In accordance with further aspects of these embodiments, an amount of precursor flowing from a solid precursor source vessel can be monitored. An amount of precursor from the solid precursor source vessel to the reaction chamber can be controlled—e.g., using a monitor and a control valve. Exemplary methods can be used to deposit epitaxial layers, including doped epitaxial layers, such as those described herein.

In accordance with yet further exemplary embodiments of the disclosure, a method of epitaxially growing a material layer on a surface of a substrate can include use of a reactor system and/or a method as described herein. The epitaxial layer can include, for example Si, Ge, SiGe, SiC, SiGeC. The dopants can include one or more dopants selected from the group consisting of Al, Ga, In, and Sb.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to gas-phase reactor systems and methods. The systems and methods as described herein can be used to process substrates, such as semiconductor wafers, to form, for example, electronic devices. By way of examples, the systems and methods described herein can be used to form or grow epitaxial layers (e.g., one or more doped semiconductor layers) on a surface of a substrate.

As used herein, the term "substrate" may refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various topologies, such as recesses, lines, and the like formed within or on at least a portion of a layer of the substrate.

Figure 1:
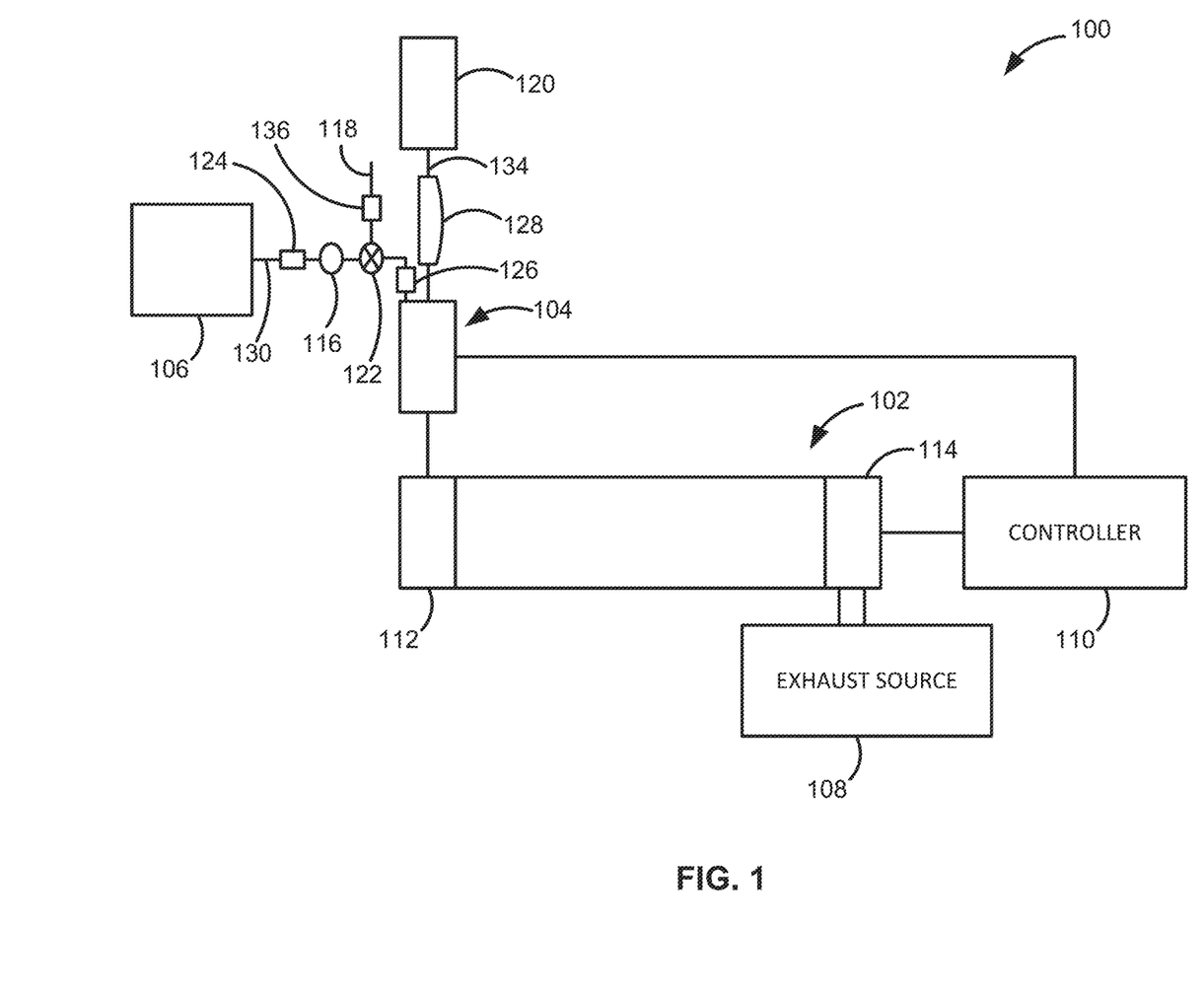
FIG. 1 illustrates a reactor system in accordance with at least one embodiment of the disclosure.

Turning now to the figures, FIG. 1 illustrates a reactor system 100 in accordance with at least one embodiment of the disclosure. Reactor system 100 includes a reaction chamber 102, a gas distribution system 104, a solid precursor source vessel 106, an exhaust source 108, and a controller 110. In the illustrated example, reactor system 100 also includes a first or inlet flange assembly 112, a second or outlet flange assembly 114, a monitor 116, a vent line 118, a second gas source 120, and one or more valves 122.

Reaction chamber 102 can be or include a reaction chamber suitable for gas-phase reactions. Reaction chamber 102 can be formed of suitable material, such as quartz, and can be configured to couple to first flange assembly 112 and/or second flange assembly 114, as described in more detail below. Reactor system 100 can include any suitable number of reaction chambers 102 and can optionally include one or more substrate handling systems. By way of example, reaction chamber 102 includes a cross flow, cold wall epitaxial reaction chamber. An exemplary reactor system including a horizontal flow reactor is available as a system from ASM.

As described in more detail below in connection with FIG. 2, gas distribution system 104 is configured to provide one or more precursors, one or more reactants, and/or one or more purge and/or carrier gasses to reaction chamber 102—e.g., via first flange assembly 112. Gas distribution system 104 can be used to meter and control gas flow rates of the one or more precursors, reactants, purge, and/or carrier gasses to reaction chamber 102. For examples, gas distribution system 104 can be used to meter gasses from solid precursor source vessel 106 and/or second gas source 120 to reaction chamber 102, each with or without a carrier gas.

Solid precursor source vessel 106 is configured to retain a precursor that is solid at room temperature and pressure and to vaporize the solid precursor for delivery of a gas phase of the precursor to reaction chamber 102. Exemplary precursors that are solid at room temperature and pressure include precursors that include Group III, Group IV, and/or Group V elements. An exemplary solid precursor source vessel is described in more detail below in connection with FIG. 4.

Exhaust source 108 can include, for example, one or more vacuum sources. Exemplary vacuum sources include one or more dry vacuum pumps and/or one or more turbomolecular pumps.

Controller 110 can be configured to perform various functions and/or steps as described herein. Controller 110 can include one or more microprocessors, memory elements, and/or switching elements to perform the various functions. Although illustrated as a single unit, controller 110 can alternatively comprise multiple devices. By way of examples, controller 110 can be used to control gas flow (e.g., by monitoring flow rates and controlling valves), motors, such as motors 230-248 described in more detail below, control flow of coolant in and/or out of cooling tubes or channels of a flange assembly, and/or control heaters, such as one or more of the heaters described herein.

First flange assembly 112 is configured to receive a first gas from gas distribution system 104 (e.g., from solid precursor source vessel 106) and to introduce the first gas to the reaction chamber through one or more expansion ports 284, 286, 288, 290, 292 within first flange assembly 112 coupled to the respective (e.g., first gas) outlets of the gas distribution system. First flange assembly 112 can be further configured to receive a second gas from gas distribution system 104 (e.g., from second gas source 120) and to introduce the second gas to the reaction chamber through one or more expansion ports 294, 296, 297, 298, 299 within first flange assembly 112 coupled to the respective (e.g., second gas) outlets of the gas distribution system. First flange assembly 112 can be similarly configured to distribute additional gasses—e.g., using additional expansion ports. Although illustrated with five expansion ports for each of the first gas and the second gas, first flange assembly 112 can include one or more expansion ports for one or more gasses. As discussed in more detail below in connection with FIG. 2, first flange assembly 112 can be heated and/or cooled.

Second flange assembly 114 can be used to facilitate exhausting of gas(es) from reaction chamber 102. An exemplary second flange assembly 114 that can be heated and/or cooled is described in more detail below in connection with FIG. 3.

Monitor 116 can be used to measure an amount or concentration of a vaporized precursor flowing between solid precursor source vessel 106 and reaction chamber 102. By way of examples, monitor 116 can be or include a piezo concentration monitor or the like. Monitor 116 can provide information (e.g., indicative of a concentration of a precursor flowing from solid precursor source vessel 106 to reaction chamber 102) to a controller, such as controller 110. Such information can be used by the controller to control a concentration, amount, or rate (e.g., volumetric) of precursor flowing from solid precursor source vessel 106 to reaction chamber 102—e.g., by controlling a control valve, such as valve 122.

Vent line 118 can be used to vent precursor and/or a carrier gas prior to the gas reaching reaction chamber 102. In the illustrated example, valve 122 can be used to vent or allow the precursor to flow to reaction chamber 102. Alternatively, two or more valves can be used to perform such functions.

Second gas source 120 can include any suitable martial. By way of examples, second gas source 120 can include an etchant, such as at least one of chlorine ($Cl_2$) or hydrochloric acid (HCl). Alternatively, second gas source 120 and/or another gas source (e.g., a solid source chemical) and/or can include a dopant precursor selected from the group consisting of borohydrides (e.g., $Ga(BH_4)_3$, $Y_xGa(BH_4)_{3-x}$ where x=0, 1, 2; Y=H, D, Cl, Br, I; $Al(BH_4)_3$, $Y_xAl(BH_4)_{3-x}$ where x=0, 1, 2; Y=H, D, Cl, Br, I; or $In(BH_4)_3$, $Y_xIn(BH_4)_{3-x}$ where x=0, 1, 2; Y=H, D, Cl, Br, I); organic compounds (e.g., $Z_xGaY_{3-x}$ where x=0, 1, 2, 3; Z=H, D; Y=Cl, Br, I, including the associated dimer structures $(Z_xGaY_{3-x})_2$; $Z_xAlY_{3-x}$ where x=0, 1, 2, 3; Z=H, D; Y=Cl, Br, I, including the associated dimer structures $(Z_xAlY_{3-x})_2$; and $Z_xInY_{3-x}$ where x=0, 1, 2, 3; Z=H, D; Y=Cl, Br, I, including the associated dimer structures $(Z_xInY_{3-x})_2$; and organohalides, such as $R_xGaY_{3-x}$ where x=1, 2, 3; R=$CH_3$, $C_2H_5$, $C_6H_5$, CF3SO3, $NH_2$; Y=Cl, Br, I; $R_xAlY_{3-x}$ where x=1, 2, 3; R=$CH_3$, $C_2H_5$, $C_6H_5$, $CF_3SO_3$, $NH_2$; Y=Cl, Br, I; and $R_xInY_{3-x}$ where x=1, 2, 3; R=$CH_3$, $C_2H_5$, $C_6H_5$, $CF_3SO_3$, $NH_2$; Y=Cl, Br, I. In the case where a ligand is a borohydride, there is potential to incorporate B as well as Ga (or Al, In). These molecules can be used as dopants in group IV layers and alloys in, for example, Si, Ge, $Si_{1-x}Ge_x$, $Si_{1-x-y}Ge_xC_y$, $Ge_{1-x}Sn_x$, $Ge_{1-x-y}Si_xSn_y$, $Ge_{1-x-y}Si_xSn_yC_z$, $Si_{1-x}Sn_x$, $Si_{1-x-y}Sn_xC_y$ material.

Reactor system 100 can also include one or more heaters 124-128, 136 and/or heaters described in more detail in connection with FIGS. 2, 3, and 5. Heaters 124-128, 136 can include traced-line heaters, such as flexible (e.g., silicone) heater tape. Heaters 124-128, 136 can be used to heat lines, such as (heated) lines 118, 130, 134 to a desired temperature, such as a temperature above a sublimation temperature or condensation temperature of a precursor or reactant from solid precursor source vessel 106 and/or second gas source 120. The temperature in lines 118, 130, 134 can be higher (e.g., about 5° C. to about 15° C. higher) than a temperature of solid precursor source vessel 106. A temperature of one or more of heaters 124-128, 136 can be controlled using controller 110 and/or one or more other controllers.

Figure 2:
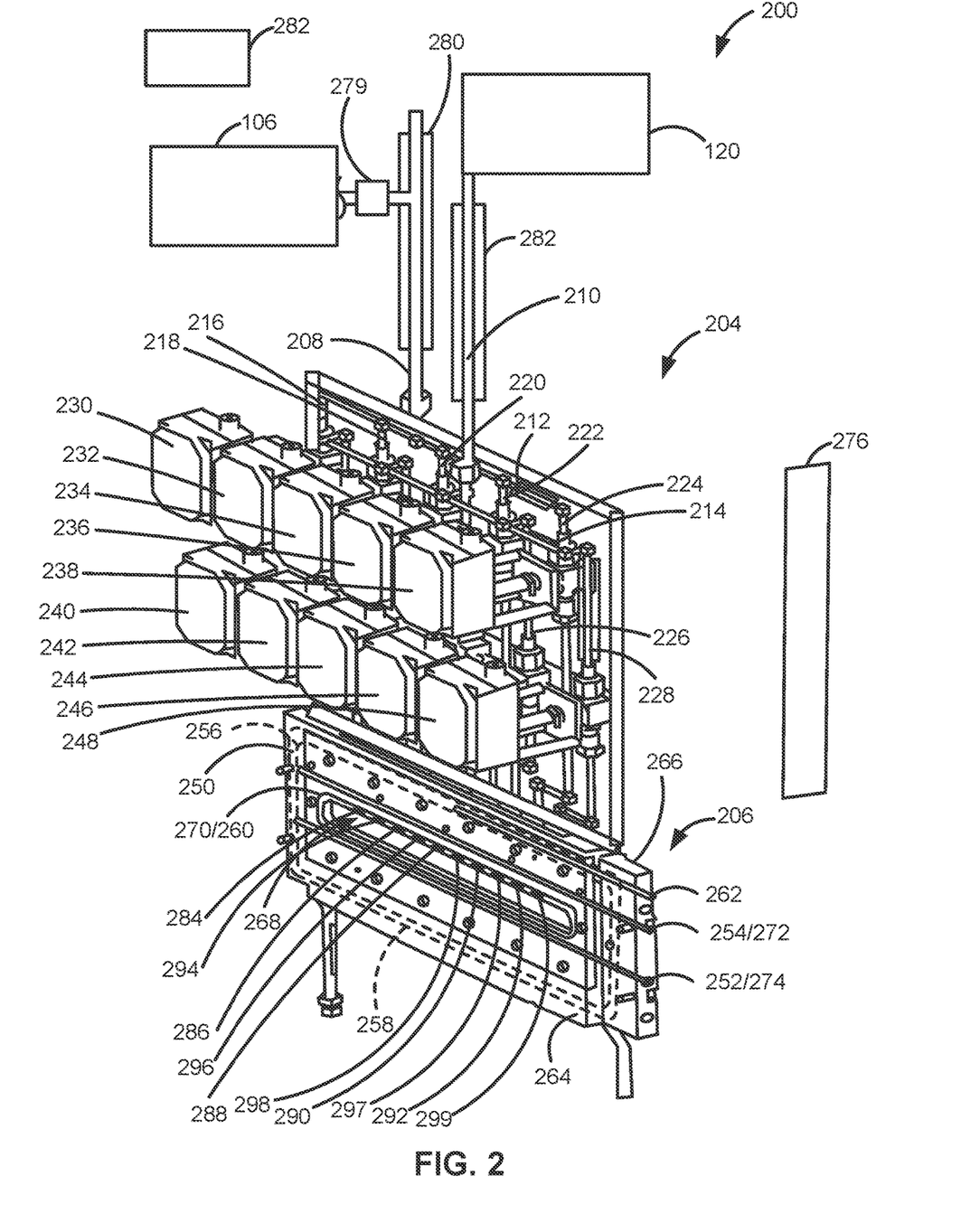
FIG. 2 illustrates an assembly including a gas distribution system and a flange assembly in accordance with at least one embodiment of the disclosure.

FIG. 2 illustrates an assembly 200, including a gas distribution system 204, suitable for use as gas distribution system 104, and a first flange assembly 206, suitable for use as first flange assembly 112, in accordance with exemplary embodiments of the disclosure. Assembly 200 includes a first gas supply (heated) line 208 (which can be the same or similar to line 130) coupled to solid precursor source vessel 106 and a second gas supply (heated) line 210 (which can be the same or similar to line 134) coupled to second gas source 120. When referring to gas lines and components of reactor system 100 and assembly 200, the term "coupled" refers to fluidly coupled, and, unless stated otherwise, the lines or components need not be directly fluidly coupled, but rather reactor system 100 and/or assembly 200 could include other intervening elements, such as valves, meters, monitors, or the like.

Gas distribution system 204 includes a first gas manifold 212 coupled to first gas supply line 208 and a second gas manifold 214 coupled to second gas supply line 210. First gas manifold 212 includes a plurality of first gas outlets 216-224 Similarly, second gas manifold 214 includes a plurality of second gas outlets. In the illustrated example, second gas manifold 214 includes five second gas outlets; only two second gas outlets 226, 228 are visible. First gas manifold 212 and second gas manifold 214 are configured to receive gas from one or more gas lines (e.g., first and second gas lines 208, 210) and distribute the respective gas into one or more channels, which are respectively defined, in part, by first gas outlets 216-224 and second gas outlets 226, 228. Although illustrated with five of each of first gas outlets 216-224 and second gas outlets 226, 228, gas distribution systems in accordance with this disclosure can include any suitable number of first, second, and/or other gas outlets, corresponding to a number of channels for the respective gases.

Gas distribution system 204 can include a plurality of flow sensors (not separately illustrated) coupled to first and second gas outlets 216-228. However, in some cases, it may be desirable to have some gas outlets that are not coupled to a flow sensor and/or to have some gas outlets that are coupled to more than one flow sensor. The flow sensors can be used to provide real-time and/or historical flow rate information to a user, for each channel—e.g., using a graphical user interface. Additionally or alternatively, the flow sensors can be coupled to a controller (e.g., controller 110) and to first gas motors 230-238 and second gas motors 240-248, which in turn, are coupled to valves (not separately illustrated) to provide controlled flowrate of the gases through the valves. Exemplary flow sensors are mass flow meters. By placing flow sensors in each gas channel, the flowrate of gas through each channel can be independently measured and controlled, regardless of the gas composition.

An exemplary injection manifold, suitable for use as gas distribution system 104 or 204 is described in U.S. application Ser. No. 15/997,445, filed Jun. 4, 2018 and entitled GAS DISTRIBUTION SYSTEM AND REACTOR SYSTEM INCLUDING SAME, the contents of which are hereby incorporated herein by reference, to the extent such contents do not conflict with the present disclosure.

Lines 208 and 210 can be heated using heaters 280, 282 (e.g., flexible (e.g., silicone) heater tape) to maintain gas within the lines at a desired temperature—e.g., to prevent or mitigate condensation of the gas. Additionally or alternatively, a heater 276 can be provided around and/or proximate gas distribution system 104/204 and/or a heater 282 can be placed near solid precursor source vessel 106 and/or lines 208, 210 to prevent and/or mitigate condensation of gas within assembly 200.

First flange assembly 206 includes a (e.g., first) flange 250, heaters 252 and 254 cooling channels, illustrated as channels 256, 258. First flange assembly 206 also includes a first sealing member 260 to form a seal with reaction chamber 102 and a second sealing member (not illustrated, but which can be the same or similar to sealing member 260) to form a seal with a gate valve (not illustrated). First flange assembly 206 also includes one or more thermocouples 262 to measure temperatures at various locations within first flange assembly 206. The temperature information from one or more thermocouples 262 can be used to provide information to controller 110 and/or to control heaters and/or cooling to first flange assembly 206. First flange assembly 206 can also include one or more heater retainers as described below.

First flange 250 can be formed of any suitable material, such as stainless steel. In the illustrated example, first flange 250 includes a first surface 264 for coupling to a reactor or reaction chamber, a second surface 266 for coupling to a cover plate and/or a gate valve, and an opening 268 between first surface 264 and second surface 266. First surface 264 includes a recess 270 to receive sealing member 260. Similarly, second surface 266 can include a recess to receive another sealing member (e.g., the same or similar to sealing member 260). Further, first flange 250 includes cooling channels 256, 258 formed therein. Cooling channels 256, 258 can be configured to receive cooling fluid directly or via tubes (e.g., pipes) within the channels. Flange 250 also includes recesses 272 and 274 to receive one or more heaters 254 and 252. Flange 250 can also include various conduits configured to keep reactants/precursors separated, until such gasses reach expansion ports 284, 286, 288, 290, 292, 294, 296, 297, 298, 299 formed within flange 250 and/or reaction chamber 102. Exemplary flange conduit configuration and ports are disclosed in U.S. application Ser. No. 14/218,690, filed Mar. 18, 2014 and entitled GAS DISTRIBUTION SYSTEM, REACTOR INCLUDING THE SYSTEM, AND METHODS OF USING THE SAME, the contents of which are hereby incorporated herein by reference, to the extent such contents do not conflict with the present disclosure.

Figure 3:
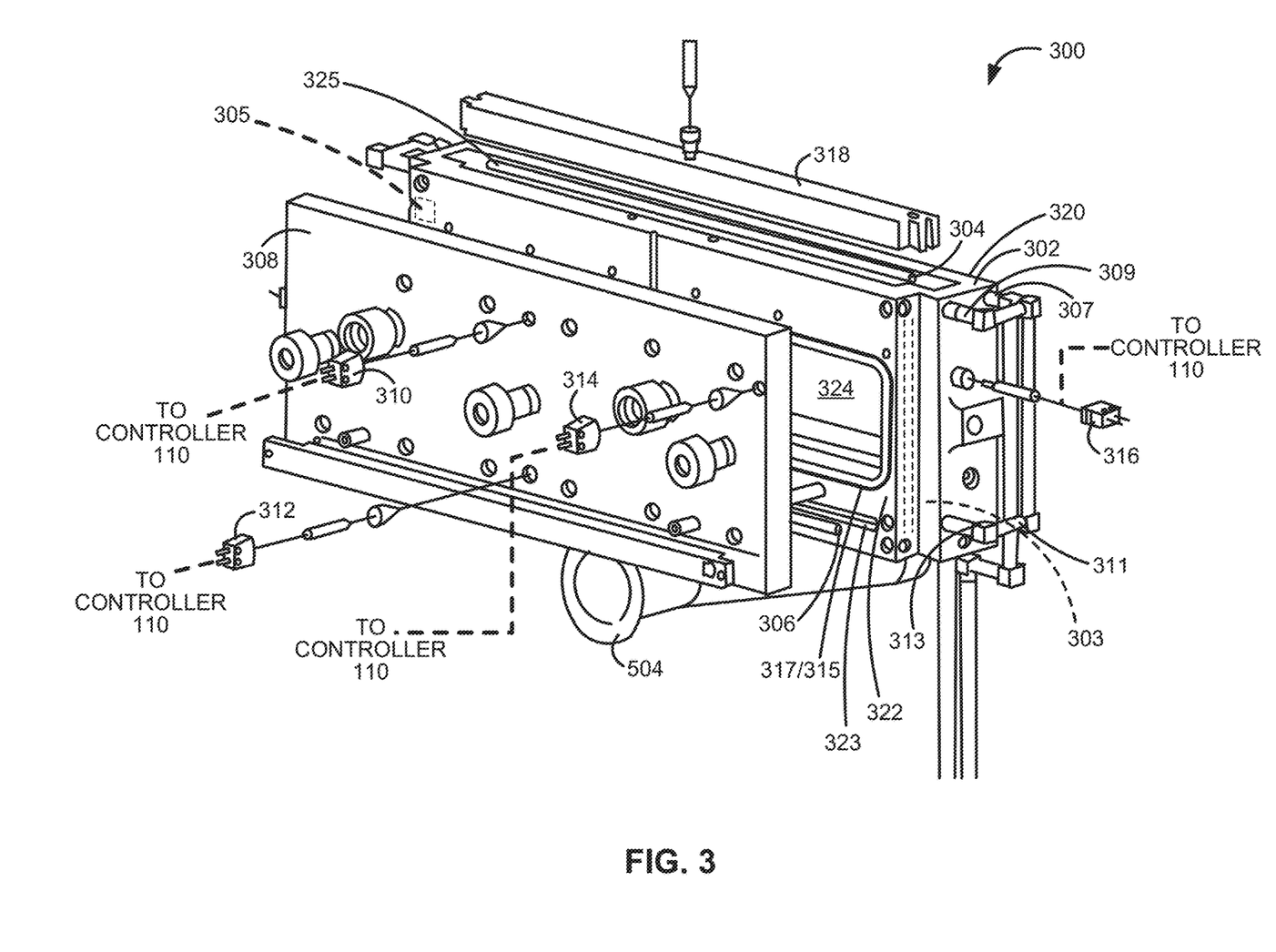
FIG. 3 illustrates another flange assembly in accordance with at least one embodiment of the disclosure.

FIG. 3 illustrates a second flange assembly 300, suitable for use as second flange assembly 114. Second flange assembly 300 includes a second flange 302, heaters 303, 304, 305 and 306, and cooling channels 307, 309, 311, 313, to receive cooling fluid, such as water. Second flange assembly 300 also includes a first sealing member to form a seal with reaction chamber 102 and a sealing member 315 to form a seal with a cover plate 308. Second flange assembly 300 also includes one or more thermocouples 310-316 to measure temperatures at various locations within second flange assembly 300. The temperature information from one or more thermocouples 310-316 can be used to provide information to controller 110 and/or to control heaters and/or cooling to second flange assembly 300. Second flange assembly 300 can also include one or more heater retainers 318 to retain the heaters in place.

Flange 302 can be formed of any suitable material, such as stainless steel or Hastelloy. Flange 302 includes a first surface 320 for coupling to a reactor or reaction chamber, a second surface 322 for coupling to cover plate 308, and an opening 324 between first surface 320 and second surface 322. First surface 320 includes a recess to receive a sealing member. Similarly, second surface 322 includes a recess 317 to receive sealing member 315. Further, flange 302 includes cooling channels 307, 309, 311, 313 formed therein. Cooling channels 307-313 can be configured to receive cooling fluid directly or via tubes (e.g., pipes). Flange 302 also includes one or more recesses, two of which recesses, 323, 325 are illustrated, to receive one or more heaters 303, 304, 305, and 306. Forming recesses within flange 302 to receive heaters 303, 304, 305, and 306 allows for placement of the heaters near an interior (reaction chamber side) of flange 302—e.g., near first surface 220. Similarly, forming cooling channels 307, 309, 311, 313 at least partially within flange 302 allows for placement of the cooling channels proximate sealing member 315 and other sealing member(s). Further, by using recesses and retainers, as illustrated, heaters 303, 304, 305, and 306 can be easily removed and replaced when desired—without removing flange 302 from reactor system 100, while allowing for placement of the heaters at desired locations within flange 302. As illustrated, flange 302 can also include one or more recesses to receive thermocouples 310-316 and/or retaining devices (e.g., screws or bolts). The recesses described herein can be machined—i.e., cut out of material used to form flange 302. Machining, rather than simply drilling holes for the heaters can allow for, for example, desired placement of the heaters within respective flanges.

Heaters 303, 304, 305, and 306 can be formed of any suitable material. By way of examples, heaters 303, 304, 305, and 306 are resistive heaters, such as those available from SAKAGUCHI E.H. VOC CORP, and Watlow. Exemplary heaters have a power of about 500 to about 1000 or about 700 Watts. Although not illustrated, heaters 303, 304, 305, and 306 can include cables to couple to controller 110 and/or to a suitable power source, which can be included as part of controller 110 or separate therefrom. By way of examples, heaters 303, 304, 305, and 306 can be configured to heat areas of flange 302 to a temperature of about 150 to about 200° C. or about 180 to about 200° C.

Sealing member 315 and other sealing members described herein can be formed of resilient material, such as heat-resistant resilient material, such as silicone, perfluoroelastomer (e.g., FFKM), such as Kalrez®, or a fluoropolymer (e.g., FKM), such as e.g., Viton™.

Thermocouples 310-316 and other thermocouples described herein can include any suitable thermocouple. Exemplary thermocouples suitable for use as thermocouples 310-316 and other thermocouples described herein are available from OMEGA Engineering.

Cover plate 308 and/or heater retainers 318 can be formed of the same material as flange 302. By way of example, cover plate 308 and heater retainers 318 are formed of stainless steel.

Figure 4:
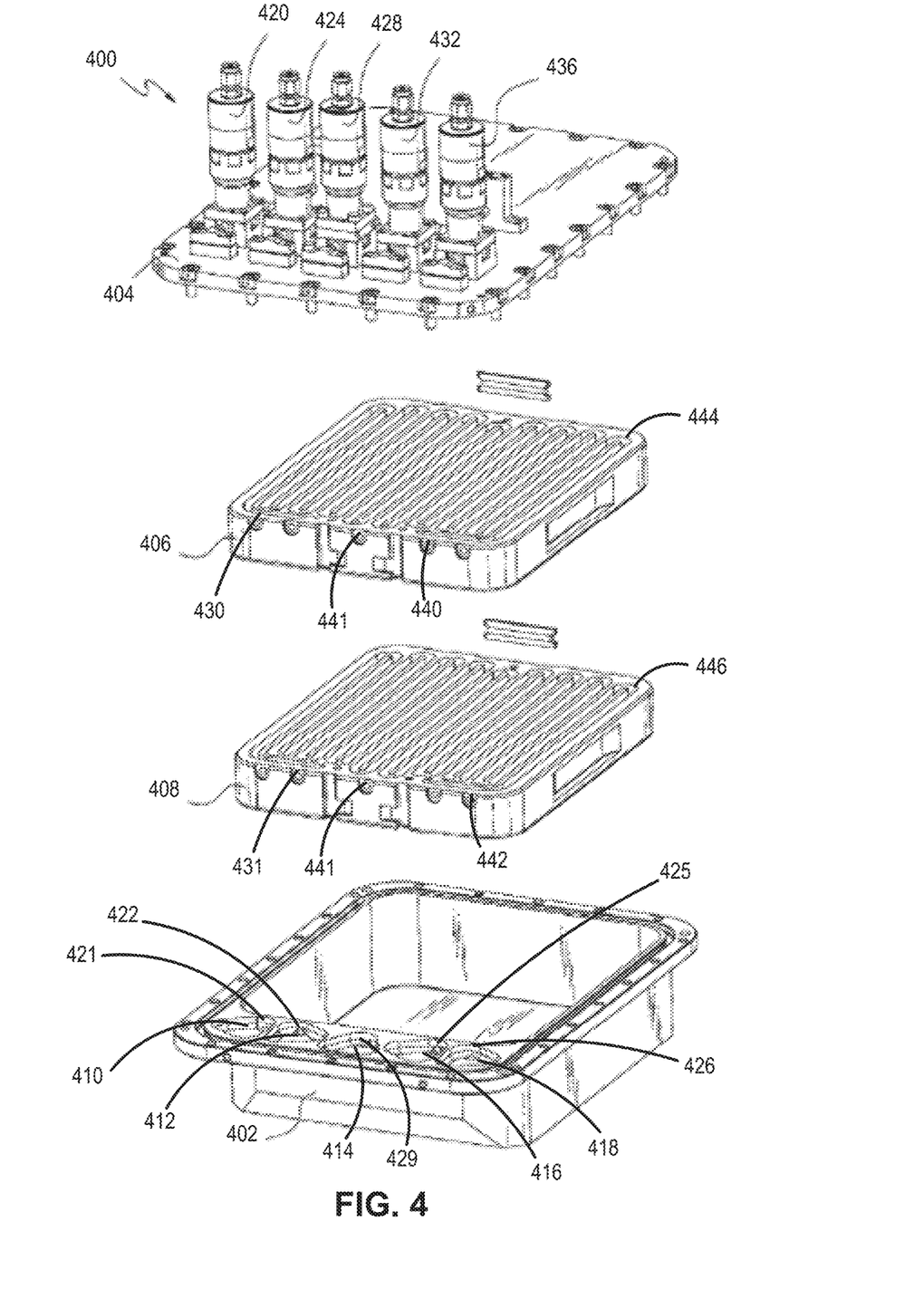
FIG. 4 illustrates a solid precursor source vessel in accordance with at least one embodiment of the disclosure.

Turning now to FIG. 4, an exemplary solid precursor source vessel 400, suitable for use as solid precursor source vessel 106, is illustrated. The illustrated solid precursor source vessel 400 includes a housing base 402, a housing lid 404, a first tray 406, and a second tray 408. Although illustrated with two trays 406, 408, solid precursor source vessels in accordance with the present disclosure can include any suitable number of trays, including one or more trays.

Housing lid 404 and housing base 402 can be configured to be mechanically attached to each other using, for example, one or more of attachment devices (e.g., bolts, screws, or the like). In certain embodiments, housing lid 404 and the housing base 402 are mechanically attached in a gas-tight fashion.

When solid precursor source vessel 400 includes multiple trays, a fluid configuration of trays 406, 408 can be such that the trays form parts of flow paths that are separate from one another, i.e., are not in direct fluid communication with one another, within solid precursor source vessel 400. However, trays 406, 408 can alternatively be in serial or parallel communication with one another. U.S. application Ser. No. 15/283,120 describes various configurations of a solid precursor source vessel suitable for use as solid precursor source vessel 400. The contents of U.S. application Ser. No. 15/283,120 are hereby incorporated herein by reference, to the extent such contents do not conflict with the present disclosure.

As illustrated in FIG. 4, solid precursor source vessel 400 can include one or more valves 420, 424, 428, 432, 436. Although illustrated with five valves, other configurations within the scope of the disclosure allow for a greater or fewer number of valves. In some embodiments, valves can be removably attached to housing lid 404.

In some configurations, housing lid 404 includes one or more (e.g., first and second) inlet valves 420, 424, one or more (e.g., first and second) outlet valves 432, 436, and/or one or more vent valves 428. In some embodiments, these valves can be attached to, but can be separate from, housing lid 404. In some embodiments, valves can be removably attached to housing lid 404.

First tray 406 and/or second tray 408 can comprise a metal, particularly stainless steel or aluminum. Similarly, in some embodiments, one or more of the housing lid 404 and/or housing base 402 can comprise a metal. First and second trays 406, 408, housing lid 404 and/or housing base 402 can each be monolithic metal parts.

Solid precursor source vessel 400 can include one or more porting recesses 410, 412, 414, 416, and 418, which can be milled into housing base 402. In certain configurations, porting recesses 410, 412, 414, 416, and 418 can be adapted to receive filters associated with corresponding valves 420, 424, 428, 432, 436, which may be mechanically attached to the housing base 402. One or more vessel inlets 421, 422, vessel outlets 425, 426, and/or a vessel vent port 429 can be milled into housing base 402. In some configurations, vessel vent port 429 can be configured to be in fluid communication with the vent valve 428. In some embodiments, one or more trays 406, 408 can include one or more tray inlets 430, 431, one or more tray outlets 440, 442 and/or one or more tray vent channels 441.

In some configurations, each of first and second trays 406, 408 can be configured to include a separate tray vent channel 441. In some configurations, one or more tray vent channels 441 can be configured to permit gas flow into and/or out of the corresponding first and/or second tray 406, 408. In certain embodiments, each of the one or more tray vent channels 441 can be in fluid communication with the vessel vent port 414, which in turn can be in fluid communication with vent valve 428. In some embodiments, the tray inlets 430, 432 can be configured to be in fluid communication with corresponding vessel inlets 421, 422. Similarly, tray outlets 440, 442 can be configured to be in fluid communication with corresponding vessel outlets 425, 426.

As further illustrated in FIG. 4, first tray 406 can include a first serpentine path 444 formed therein and second tray 408 can include a second serpentine path 446 formed therein. Each serpentine path 444, 446 can be adapted to hold solid source chemical and allow the flow of (e.g., carrier) gas thereover. In some configurations, each serpentine path 444, 446 can be milled and/or machined into first and/or second tray 406, 408 or first and/or second tray 406, 408 can be molded to have serpentine path 444, 446. In some embodiments, the serpentine path(s) 444, 446 can be milled out of a solid (e.g., cast) metal block.

Serpentine path 444, 446 can be in fluid communication with a corresponding tray inlet 430, 432, a corresponding tray outlet 440, 442 and/or a corresponding tray vent channel 441. Each serpentine path 444, 446 can be in fluid communication with a corresponding inlet valve, 420, 424, a corresponding outlet valve 432, 436, and/or a vent valve 428.

It will be appreciated that longer path lengths can increase a surface area of gas exposure of the solid source chemical. A serpentine path 444, 446 for each of first and second tray 406, 408 can have a length in the range of about 2000 mm-8000 mm. In some embodiments, the serpentine path 444, 446 can have a length in the range of about 3000 mm-5000 mm, or about 3973 mm. The total path length of first and second trays 406, 408 can therefore be in the range of about 6000 mm-10000 mm, or about 7946 mm.

Figure 5:
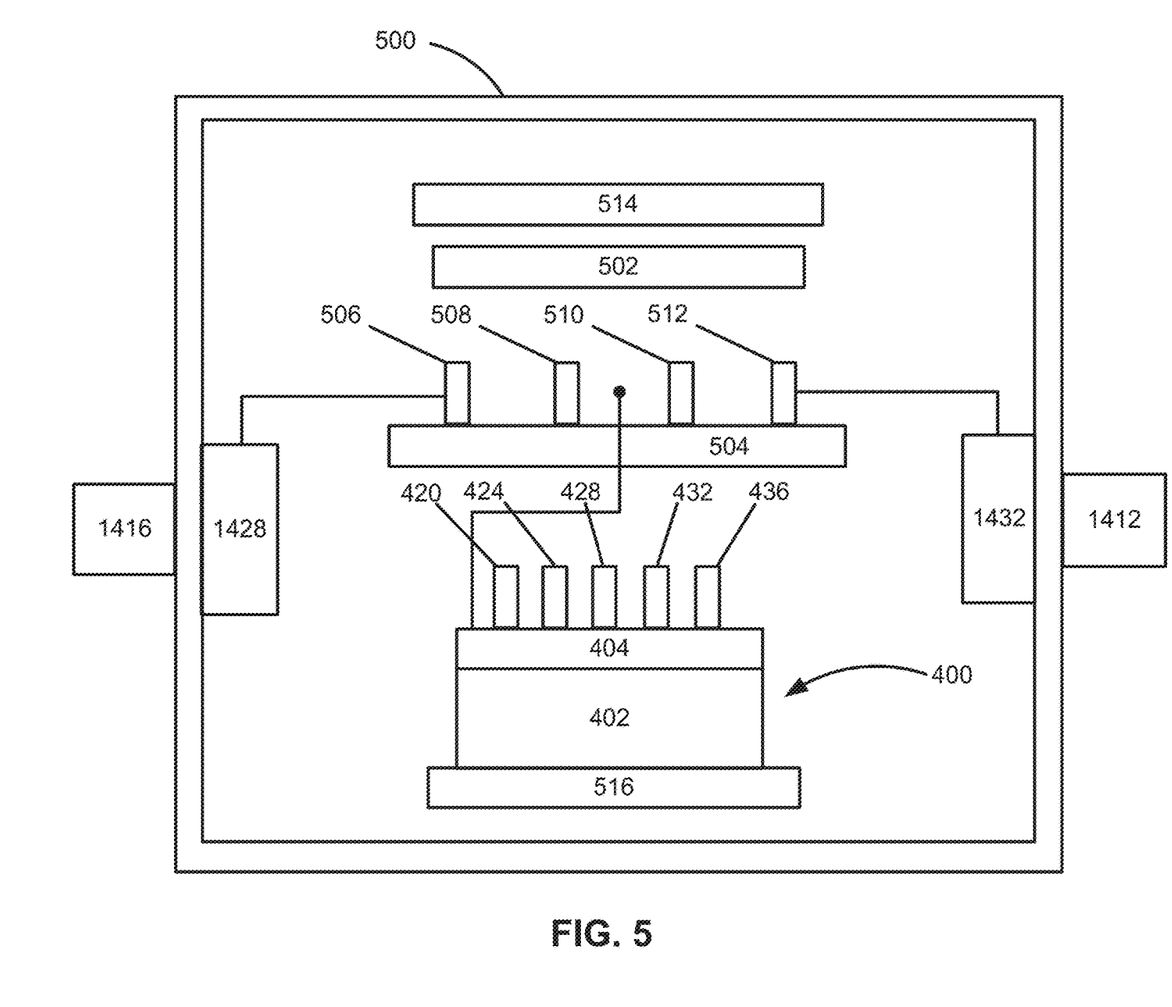
FIG. 5 schematically illustrates a solid source assembly in accordance with at least one embodiment of the disclosure.

FIG. 5 schematically illustrates a solid source assembly 500 that includes a valve plate heater 502 configured to heat a valve plate 504 (e.g., of a gas distribution system, such as gas distribution system 104) and associated valves 506, 508, 510, 512. In some embodiments, valve plate heater 502 is configured and positioned to heat valve plate 504 using radiant heat. In some embodiments, a vessel heater 514 is configured to heat a solid precursor source vessel 400 and its associated valves 420, 424, 428, 432, 436. In some embodiments, vessel heater 514 is configured to heat solid precursor source vessel 400 using radiant heat. In some embodiments, another vessel heater 516 can be disposed below housing base 402. In some configurations, another vessel heater 516 is configured to heat housing base 402 by conduction.

With continued reference to FIG. 5, gas can flow from the solid precursor source vessel 400 to valve plate 504. In some embodiments, the gas can be directed to one or more hot feed throughs 1412, 1416 via feed ports 1428, 1432. Some embodiments are configured such that gas flow can be directed from the one or more hot feed throughs 1412, 1416 to one or more reaction chambers (e.g., reaction chamber 102).

In some embodiments, solid precursor source vessel 400 can operate at a vacuum pressure. In some embodiments, the vacuum pressure can be greater than a pressure within reaction chamber 102. For example, a pressure within solid precursor source vessel 400 can be in the range of about 0.5 Torr-20 Torr, such as 5 Torr. In certain embodiments, the vacuum pressure in the solid source assembly can be regulated using one or more pressure controllers.

In some embodiments, the vent valve 428 can be used to vent off pressurized inert gas from one or more trays and/or one or more valves in the systems and/or methods described herein.

In a typical arrangement, a carrier gas flows through the solid precursor source vessel 400 (e.g., above the solid chemical bed in the serpentine path 444, 446). However, in other embodiments, a precursor vapor can be drawn out of the vessel by an external gas flow that creates a lower pressure outside of the vessel, as in a Venturi effect. For example, the precursor vapor can be drawn by flowing a carrier gas toward the one or more reaction chambers 102 along a path downstream of the vessel. Under some conditions, this can create a pressure differential between the vessel and the flow path of the carrier gas. This pressure differential causes the precursor vapor within solid precursor source vessel 400 to flow toward the one or more reaction chambers 102.

The example embodiments of the disclosure described above do not limit the scope of the invention, since these embodiments are merely examples of the embodiments of the invention. For example, although illustrated with a solid precursor source vessel, some examples may not include a solid source precursor vessel. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

We claim:

1. A reactor system comprising:
   a reaction chamber;
   a solid precursor source vessel, containing a solid source chemical, fluidly coupled to the reaction chamber;
   a gas distribution system fluidly coupled to the solid precursor source vessel, the gas distribution system comprising a first gas line coupled to a plurality of first gas outlets; and
   a flange assembly comprising a flange, comprising an elongated opening to receive a substrate, and a plurality of outlet ports, each outlet port of the plurality of outlet ports coupled to a first gas outlet of the plurality of first gas outlets,
   wherein the flange assembly comprises at least one heater above the elongated opening, the at least one heater extending linearly along an upper side of the elongated opening, and
   wherein the plurality of outlet ports are disposed proximate to the upper side of the elongated opening and between the elongated opening and the at least one heater above the elongated opening.

2. The reactor system of claim 1, wherein the flange assembly comprises at least one heater below the elongated opening, the at least one heater below the elongated opening extending linearly along a lower side of the elongated opening opposite the upper side.

3. The reactor system of claim 2, wherein the at least one heater above the elongated opening and the at least one heater below the elongated opening both extend through the flange.

4. The reactor system of claim 1, wherein the flange assembly comprises at least one cooling channel above the elongated opening and above the at least one heater.

5. The reactor system of claim 4, wherein the flange assembly comprises at least one cooling channel below the elongated opening, the at least one cooling channel below the elongated opening extending linearly along a lower side of the elongated opening opposite the upper side.

6. The reactor system of claim 5, wherein the cooling channels extend through a body of the flange.

7. The reactor system of claim 4, wherein the plurality of outlet ports are disposed proximate to the upper side of the elongated opening so as to be between the elongated opening and the at least one cooling channel above the elongated opening.

8. The reactor system of claim 1, wherein the flange assembly comprises a first surface comprising a recess to receive a sealing member.

9. The reactor system of claim 8, wherein the sealing member is formed of a material selected from the group consisting of perfluoroelastomer and fluoropolymer.

10. The reactor system of claim 1, wherein the reaction chamber comprises an epitaxial reaction chamber.

11. The reactor system of claim 1, wherein the solid precursor source vessel comprises:
    a housing base;
    a housing lid;
    a first inlet valve mounted on the housing lid and in fluid communication with a first serpentine path;
    a first outlet valve mounted on the housing lid and in fluid communication with the first serpentine path;
    a second inlet valve mounted on the housing lid and in fluid communication with a second serpentine path;
    a second outlet valve mounted on the housing lid and in fluid communication with the second serpentine path; and
    a vent valve mounted and in fluid communication with at least one of the first and second serpentine paths.

12. The reactor system of claim 1, further comprising a monitor between the solid precursor source vessel and the reaction chamber to monitor an amount of a precursor flowing between the solid precursor source vessel and the reaction chamber.

13. The reactor system of claim 1, wherein the at least one heater above the elongated opening is a linear resistive heater positioned in the flange to extend parallel to a longitudinal axis of the elongated opening.

14. The reactor system of claim 1, wherein the gas distribution system further comprises a second gas line coupled to a plurality of second gas outlets.

15. The reactor system of claim 14, wherein the second gas line is fluidly coupled to a second gas source comprising an etchant.

16. The reactor system of claim 1, wherein the gas distribution system further comprises a plurality of first gas motors to control flow of gas from the solid precursor source vessel to the reaction chamber.

17. The reactor system of claim 16, further comprising a plurality of second gas motors to control a gas from the second gas source to the reaction chamber.

18. The reactor system of claim 1, further comprising a heater attached to and contacting the gas supply line.

19. A reactor system comprising:
    a reaction chamber;
    a solid precursor source vessel, containing a solid source chemical, fluidly coupled to the reaction chamber;
    a gas distribution system spaced apart from the solid precursor source vessel and fluidly coupled to the solid precursor source vessel by a gas supply line; and
    a flange assembly comprising a flange comprising an elongated opening to receive a substrate and a plurality of outlet ports extending in a linear pattern adjacent to an upper side of the elongated opening, each outlet port of the plurality of outlet ports coupled to a separate valve of the gas distribution system,
    wherein the flange assembly comprises at least one heater above the upper side of the elongated opening that extends parallel to the linear pattern of the plurality of outlet ports, the plurality of outlet ports being disposed between the at least one heater and the elongated opening.

20. The reactor system of claim 19, a heater attached to and contacting the gas supply line.

* * * * *